US011883923B2

(12) United States Patent
Zhang et al.

(10) Patent No.: US 11,883,923 B2
(45) Date of Patent: Jan. 30, 2024

(54) CHEMICAL MECHANICAL POLISHING USING TIME SHARE CONTROL

(71) Applicant: Applied Materials, Inc., Santa Clara, CA (US)

(72) Inventors: Jimin Zhang, San Jose, CA (US); Jianshe Tang, San Jose, CA (US); Brian J. Brown, Palo Alto, CA (US); Wei Lu, Fremont, CA (US); Priscilla Diep LaRosa, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/716,941

(22) Filed: Apr. 8, 2022

(65) Prior Publication Data

US 2022/0234163 A1 Jul. 28, 2022

Related U.S. Application Data

(62) Division of application No. 16/688,604, filed on Nov. 19, 2019, now Pat. No. 11,298,794.

(Continued)

(51) Int. Cl.
*B24B 37/005* (2012.01)
*H01L 21/321* (2006.01)
(Continued)

(52) U.S. Cl.
CPC ............ *B24B 37/005* (2013.01); *B24B 37/26* (2013.01); *H01L 21/30625* (2013.01); *H01L 21/3212* (2013.01)

(58) Field of Classification Search
CPC ........... H01L 21/30625; H01L 21/3212; B24B 37/26; B24B 37/005
See application file for complete search history.

(56) References Cited

U.S. PATENT DOCUMENTS

| 5,081,796 A | 1/1992 | Schultz |
| 6,093,651 A | 7/2000 | Andideh |

(Continued)

FOREIGN PATENT DOCUMENTS

| CN | 104781913 | 7/2015 |
| CN | 106537563 | 3/2017 |

(Continued)

OTHER PUBLICATIONS

International Search Report and Written Opinion in International Appln. No. PCT/US2020/020974, dated Jun. 24, 2020, 11 pages.

(Continued)

*Primary Examiner* — Binh X Tran
(74) *Attorney, Agent, or Firm* — Fish & Richardson P.C.

(57) ABSTRACT

A method of chemical mechanical polishing includes rotating a polishing pad about an axis of rotation, positioning a substrate against the polishing pad, the polishing pad having a groove that is concentric with the axis of rotation, oscillating the substrate laterally across the polishing pad such that a central portion of the substrate and an edge portion of the substrate are positioned over a polishing surface of the polishing pad for a first duration, and holding the substrate substantially laterally fixed in a position such that the central portion of the substrate is positioned over the polishing surface of the polishing pad and the edge portion of the substrate is positioned over the groove for a second duration.

14 Claims, 9 Drawing Sheets

Related U.S. Application Data

(60) Provisional application No. 62/816,015, filed on Mar. 8, 2019.

(51) Int. Cl.
  *H01L 21/306* (2006.01)
  *B24B 37/26* (2012.01)

(56) References Cited

U.S. PATENT DOCUMENTS

| | | | |
|---|---|---|---|
| 6,273,806 | B1 | 8/2001 | Bennett et al. |
| 10,792,783 | B2 * | 10/2020 | Hu .................. B24B 53/005 |
| 11,298,794 | B2 | 4/2022 | Zhang et al. |
| 2002/0068450 | A1 | 6/2002 | Halley |
| 2010/0035527 | A1 | 2/2010 | Jindal et al. |
| 2010/0159811 | A1 * | 6/2010 | Muldowney ............ B24B 37/26 451/527 |
| 2011/0256812 | A1 | 10/2011 | Dhandapani et al. |
| 2012/0021673 | A1 | 1/2012 | Chen et al. |
| 2013/0017764 | A1 * | 1/2013 | Allison ................ B24B 37/005 451/6 |
| 2014/0024299 | A1 * | 1/2014 | Tu ........................ B24B 37/26 451/282 |
| 2017/0036319 | A1 * | 2/2017 | Chen ..................... B24B 37/26 |
| 2017/0151647 | A1 | 6/2017 | Duboust et al. |
| 2017/0203408 | A1 * | 7/2017 | Ganapathiappan ..... B24B 37/24 |
| 2018/0056477 | A1 | 3/2018 | Butterfield et al. |
| 2019/0375069 | A1 * | 12/2019 | Hahn ..................... G05B 13/04 |

FOREIGN PATENT DOCUMENTS

| | | |
|---|---|---|
| CN | 109075054 | 12/2018 |
| JP | H08-243913 | 9/1996 |
| JP | 2000-117620 | 4/2000 |
| JP | 2001-001255 | 1/2001 |
| JP | 2001-054856 | 2/2001 |
| JP | WO 2008/114805 | 9/2008 |
| JP | 2008-258574 | 10/2008 |
| JP | 2018-114582 | 7/2018 |
| KR | 10-2000-0025003 | 5/2000 |
| KR | 10-2005-0106904 | 11/2005 |
| KR | 10-1781184 | 10/2017 |
| KR | 10-2018-0075157 | 7/2018 |
| KR | 10-2018-0083099 | 7/2018 |

OTHER PUBLICATIONS

Office Action in Japanese Appln. No. 2021-553043, dated Oct. 18, 2022, 6 pages (with English translation).

Office Action in Chinese Appln. No. 202080027685.2, dated Feb. 27, 2023, 13 pages (with English translation).

* cited by examiner

CHEMICAL MECHANICAL POLISHING USING TIME SHARE CONTROL

CROSS-REFERENCE TO RELATED APPLICATIONS

This application is a divisional of U.S. application Ser. No. 16/688,604, filed Nov. 19, 2019, which claims priority to U.S. Provisional Application Ser. No. 62/816,015, filed Mar. 8, 2019, the disclosure of which is incorporated by reference.

TECHNICAL FIELD

The present disclosure relates to a chemical mechanical polishing of substrates.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

One issue in polishing is non-uniformity in the polishing rate across the substrate. For example, the edge portion of a substrate can polish at a higher relative to the central portion of the substrate.

SUMMARY

In one aspect, a method for chemical mechanical polishing includes rotating a polishing pad about an axis of rotation, positioning a substrate against the polishing pad, oscillating the substrate laterally across the polishing pad such that a central portion of the substrate and an edge portion of the substrate are positioned over a polishing surface of the polishing pad for a first duration such that the central portion of the substrate and the edge portion of the substrate are polished for the first duration, and holding the substrate substantially laterally fixed in a position such that the central portion of the substrate is positioned over the polishing surface of the polishing pad and the edge portion of the substrate is positioned over a polishing-control groove for a second duration such that the central portion of the substrate is polished the second duration.

In another aspect, a polishing system includes a rotatable platen to support a polishing pad, a carrier head radially movable across the polishing pad to hold a substrate against the polishing pad, an actuator to move the carrier head, and a controller coupled to the actuator. The controller is and configured to cause the carrier head to oscillate the substrate laterally across the polishing pad for a first duration, such that a central portion of the substrate and an edge portion of the substrate are positioned over a polishing surface of the polishing pad, and to hold the substrate substantially laterally fixed a position for a second duration such that the central portion of the substrate is positioned over the polishing surface of the polishing pad and the edge portion of the substrate is positioned over a polishing-control groove.

In another aspect, a polishing pad includes a polishing layer having a central region with a plurality of slurry-supply grooves formed therein and an outer region having a polishing-control groove formed therein, with the polishing control groove being wider than the slurry-supply grooves.

In another aspect, a method for determining dwell time includes determining a polishing rate of central region of a test substrate as polished by a polishing surface of a polishing pad, determining an edge polishing rate of an edge portion of the substrate as polished by the polishing surface of the polishing pad, determining a desired decrease in polishing rate for the edge portion of the substrate to reduce polishing non-uniformity between the central portion of the substrate and the edge portion of the substrate, and calculating a first duration and a second duration to provide the desired decrease in polishing rate. The first duration is for the device substrate to oscillate laterally across the polishing pad such that a central portion of the device substrate and an edge portion of the substrate edge are positioned on the polishing pad, and the second duration is for holding the device substrate substantially laterally fixed in a position such that the central portion of the substrate is positioned on the polishing surface of the polishing pad and the edge portion of the substrate is positioned over a groove.

Implementations may include one or more of the following features.

A ratio of the second duration to the second duration may be selected to provide a desired polishing rate for the edge portion.

The polishing pad may have slurry-supply grooves. The slurry supply grooves may be narrower than the polishing control groove. The slurry supply grooves may be concentric with the polishing control groove. The polishing control groove may surround the slurry supply grooves. The polishing control groove may be positioned near an edge of the polishing pad. The polishing control groove may be 5 to 30 mm wide.

Dwell time may be calculated using a radius of the groove, a radius of the substrate, and a distance from a center of the polishing pad to a center of the substrate.

Implementations may optionally include, but are not limited to, one or more of the following advantages. Polishing non-uniformity, e.g., caused by different polishing rates at different portions of the substrate, can be controlled and corrected. For example, controlling the position of the substrate relative to the non-polishing groove can provide edge-correction. Additionally, there is a minimal impact to throughput because the adjustment to polishing can be performed in the polishing station rather than as part of a separate module. Furthermore, a second station is not necessary to perform the edge-correction, reducing the footprint needed in the polishing station clean room.

The details of one or more implementations are set forth in the accompanying drawings and the description below. Other aspects, features, and advantages will be apparent from the description and drawings, and from the claims.

BRIEF DESCRIPTION OF THE DRAWINGS

Like reference numbers and designations in the various drawings indicate like elements.

DETAILED DESCRIPTION

As noted above, when a substrate is polished by a polishing pad, the edge portion of the substrate can polish at a higher rate than a central portion of the substrate, resulting in a non-uniformly polished substrate. However, positioning, and holding, the substrate over a polishing control groove can reduce the non-uniformity of the polished substrate. The polishing control groove can be located nearer a perimeter of the polishing pad, or nearer a center of the polishing pad, or the polishing pad can include a first polishing control groove nearer the perimeter and a second polishing control groove nearer the center.

Figure 1:
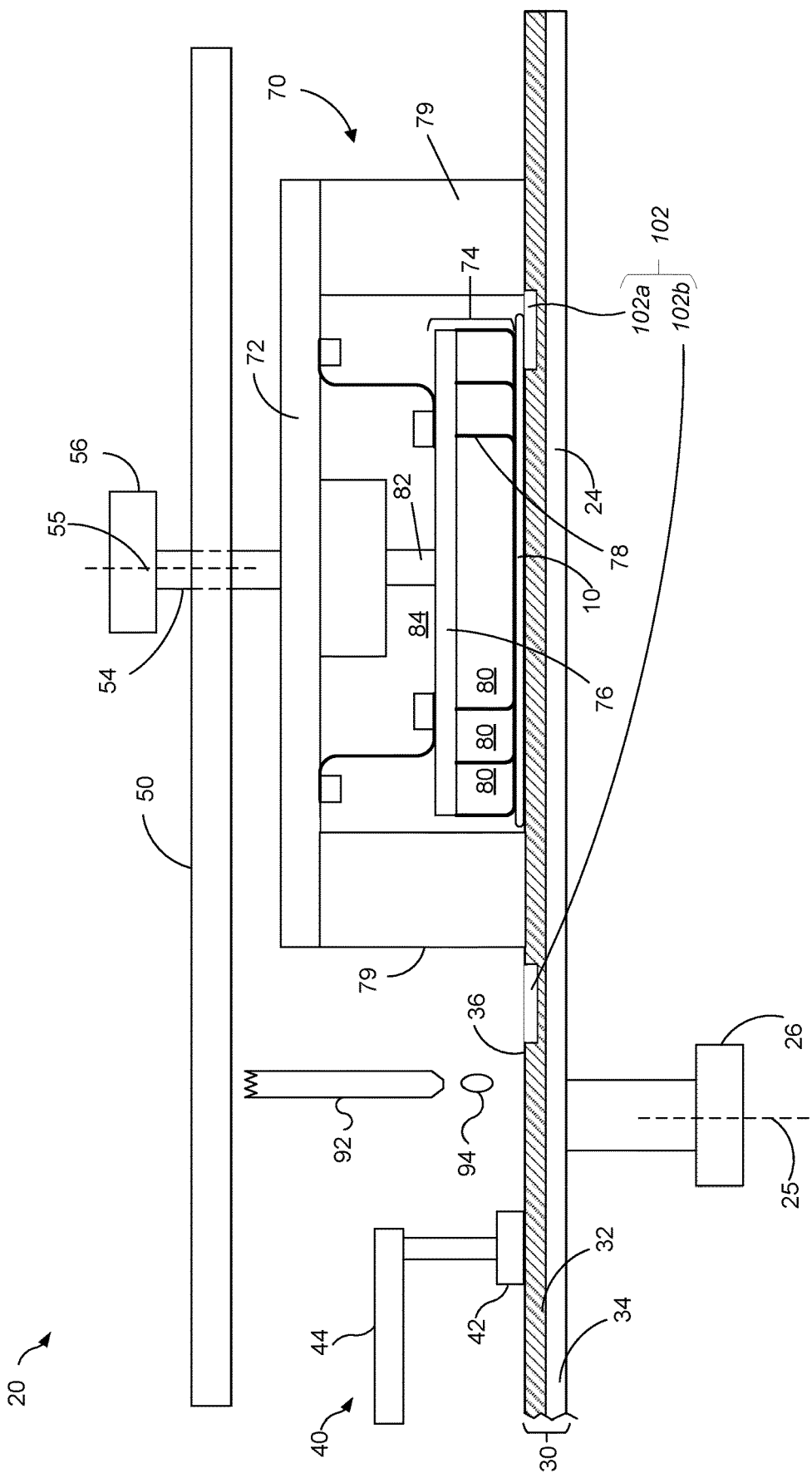
FIG. 1 is a schematic cross-sectional view of a chemical mechanical polishing system with a polishing pad having a groove.

FIG. 1 illustrates an example of a polishing station of a chemical mechanical polishing system 20. The polishing system 20 includes a rotatable disk-shaped platen 24 on which a polishing pad 30 is situated. The platen 24 is operable to rotate about an axis 25. For example, a motor 26 can turn a drive shaft 28 to rotate the platen 24. The polishing pad 30 can be a two-layer polishing pad with an outer polishing layer 32 and a softer backing layer 34. The outer polishing layer 32 has a polishing surface 36.

The polishing system 20 can include a supply port or a combined supply-rinse arm 92 to dispense a polishing liquid 94, such as an abrasive slurry, onto the polishing pad 30. The polishing system 20 can include a pad conditioner apparatus 40 with a conditioning disk 42 to maintain the surface roughness of the polishing surface 36 of the polishing pad 30. The conditioning disk 42 can be positioned at the end of an arm 44 that can swing so as to sweep the disk 42 radially across the polishing pad 30.

A carrier head 70 is operable to hold a substrate 10 against the polishing pad 30. The carrier head 70 is suspended from a support structure 50, e.g., a carousel or a track, and is connected by a drive shaft 58 to a carrier head rotation motor 56 so that the carrier head can rotate about an axis 55. Optionally, the carrier head 70 can oscillate laterally, e.g., on sliders on the carousel, by movement along the track, or by rotational oscillation of the carousel itself.

The carrier head 70 includes a housing 72, a substrate backing assembly 74 which includes a base 76 and a flexible membrane 78 that defines a plurality of pressurizable chambers 80, a gimbal mechanism 82 (which may be considered part of the assembly 74), a loading chamber 84, a retaining ring assembly 100, and an actuator 122.

The housing 72 can generally be circular in shape and can be connected to the drive shaft 58 to rotate therewith during polishing. There may be passages (not illustrated) extending through the housing 72 for pneumatic control of the carrier head 100. The substrate backing assembly 74 is a vertically movable assembly located beneath the housing 72. The gimbal mechanism 82 permits the base 76 to gimbal relative to the housing 72 while preventing lateral motion of the base 76 relative to the housing 72. The loading chamber 84 is located between the housing 72 and the base 76 to apply a load, i.e., a downward pressure or weight, to the base 76 and thus to the substrate backing assembly. The vertical position of the substrate backing assembly 74 relative to a polishing pad is also controlled by the loading chamber 84. The lower surface of the flexible membrane 78 provides a mounting surface for a substrate 10.

In some implementation, the substrate backing assembly 74 is not a separate component that is movable relative to the housing 72. In this case, the chamber 84 and gimbal 82 are unnecessary.

Referring to FIG. 1, the polishing pad 30 has at least one polishing control groove 102 formed in the polishing surface 36. Each polishing control groove 102 is a recessed area of the polishing pad 30. Each polishing control groove 102 can be an annular groove, e.g., circular, and can be concentric with the axis of rotation 25. Each polishing control groove 102 provides an area of the polishing pad 30 that does not contribute to polishing.

The walls of the polishing control groove 102 are perpendicular to the polishing surface 36. The bottom surface of the polishing control groove 102 is parallel with the polishing surface 36, although in some implementations the bottom surface of the polishing control groove 102 can be angled relative to the polishing surface 36. The bottom of the polishing control groove 102 can have a rectangular or a U-shaped cross-section. The polishing control groove 102 can be 10 to 80 mils, e.g., 10 to 60 mils, deep.

In some implementations, the pad 30 includes a polishing control groove 102a located near the outer edge of the polishing pad 30, e.g., within 15%, e.g., with 10% (by radius) of the outer edge. For example, the groove 102a can be located at a radial distance of fourteen inches from the center of a platen having a thirty inch diameter.

In some implementations, the pad 30 includes a polishing control groove 102b located near the center of the polishing pad 30, e.g., within 15%, e.g., with 10% (by radius) of the center or axis of rotation 25. For example, the groove 102b can be located at a radial distance of one inch from the center of a platen having a thirty inch diameter.

Figure 3A:
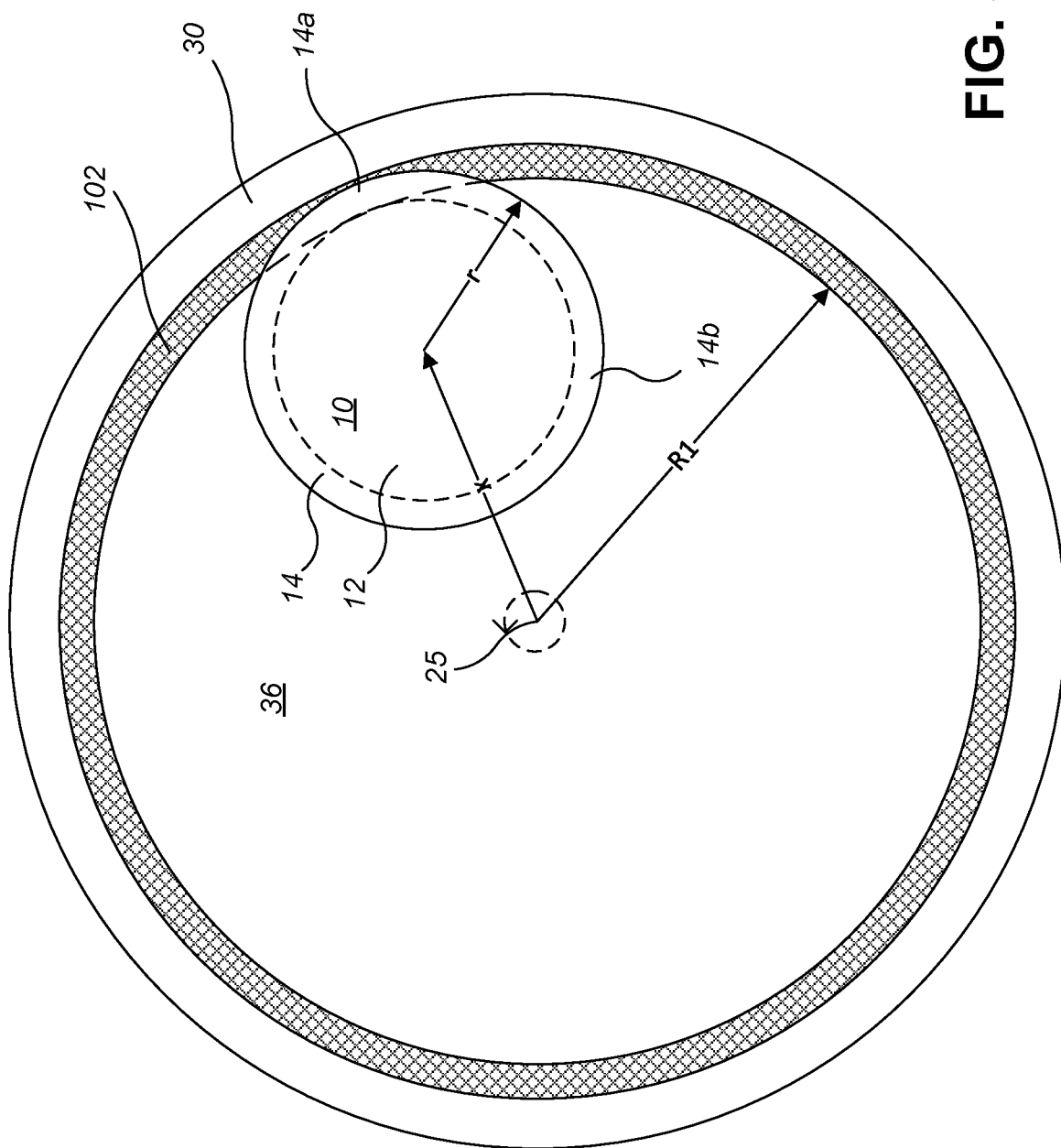
FIG. 3A is a schematic top view of a polishing pad having a groove that is concentric with the axis of rotation.

In some implementations, the pad 30 includes only a polishing control groove 102a located near the outer edge of the polishing pad 30 (see FIG. 3A). In this case, there can be just a single control polishing groove 102 near the outer edge of the polishing pad 30. In some implementations, the pad 30 includes only a polishing control groove 102b located near the center of the polishing pad 30 (see FIG. 3B). In this case, there can be just a single control polishing groove 102 near the center of the polishing pad 30. In some implementations, the pad 30 includes a first polishing control groove 102a located near the edge of the polishing pad 30 and a first polishing control groove 102b located near the center of the polishing pad 30 (see FIG. 3C). In this case, there can be exactly two polishing grooves 102 on the polishing surface.

Returning to FIG. 1, the polishing control groove 102 is sufficiently wide that the by positioning a section of the substrate 10 over the groove, the polishing rate of that section will be materially reduced. In particular, for edge-correction, the groove 102 is sufficiently wide that an annular band at the edge of the substrate, e.g., a band at least 3 mm wide, e.g., a band 3-15 mm wide, e.g., a band 3-10 mm wide, will have a reduced polishing rate. The polishing control groove 102 can have a width of three to fifty, e.g., five to fifty, e.g., three to ten, e.g., ten to twenty, millimeters.

When the substrate 10 is positioned over the polishing surface 36 of the polishing pad 30, the polishing surface 36 contacts and polishes the substrate 10, and material removal takes place. On the other hand, when an edge of the substrate 10 is positioned above the polishing control groove 102, there is no contact or polishing of the edge of substrate 10 to cause removal takes place. Optionally, the groove 102 can provide a conduit for polishing slurry to pass through without abrading the substrate 10.

Figure 2:
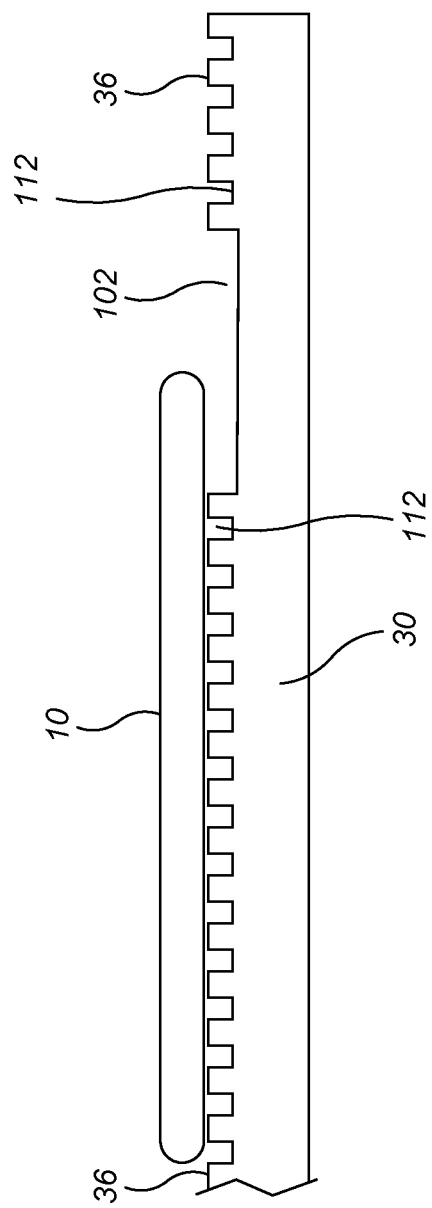
FIG. 2 is a schematic cross-sectional view of a polishing pad having both slurry-supply grooves and a polishing-control groove.

Referring now to FIG. 2, the polishing pad 30 can also include one or more slurry-supply grooves 112. The slurry-supply grooves 112 can be annular grooves, e.g., circular grooves, and can be concentric with the polishing control groove 102. Alternatively, the slurry supply grooves can have another pattern, e.g., rectangular cross-hatch, triangular cross-hatch, etc. The slurry supply grooves can have a width between about 0.015 and 0.04 inches (between 0.381 and 1.016 mm), such as 0.20 inches, and a pitch between about 0.09 and 0.24 inches, such as 0.12 inches.

The slurry-supply grooves 112 are narrower than the polishing control groove 102. For example, the slurry-supply grooves 112 can be narrower by a factor of at least 3, e.g., at least 6, such as 6 to 100. The slurry supply grooves 112 can be uniformly spaced across the polishing pad 30. The polishing control groove 102 can have a smaller, similar, or greater depth than the slurry-supply grooves 112. In some implementations, the polishing control groove 102 is the only groove on the polishing pad wider than the slurry supply grooves 112. In some implementations, the polishing control grooves 102a and 102b are the only grooves on the polishing pad wider than the slurry supply grooves 112.

Referring now to FIG. 3A, for a first duration, the substrate 10 can be positioned in a first position or first range of positions such that the central portion 12 of the substrate 10 and the edge portion 14 of the substrate 10 are both polished by the polishing surface 36 of the polishing pad 30. As such, none of the substrate 10 overlaps the polishing control groove 102. Although portions of the substrate 10 overlap the slurry-supply grooves 112, the slurry-supply grooves 112 are relatively closely spaced and relative motion averages out any effects on the polishing rate.

For a second duration, the substrate 10 can be positioned such that the central portion 12 of the substrate 10 is polished by the polishing surface 36 and a region 14a of the edge portion 14 of the substrate 10 is above the polishing control groove 102. During the second duration, the substrate 10 can be held laterally fixed in a second position. Thus the central portion 12 of the substrate 10 is polished during the second duration, whereas a region 14a of the edge portion 14 of the substrate 10, positioned above the polishing control groove 102, is not polished. Since some of the edge portion 14 (indicated by 14b) remains over the polishing surface 36, the edge portion 14 will still be polished to some degree. Due to rotation of the substrate 10, the edge portion 14 should still be polished in an angularly uniform manner, but at a lower rate than the central portion 12 due to lack of polishing in region 14a. In addition, although portions of the substrate 10 overlap the slurry-supply grooves 112, the slurry-supply grooves 112 are relatively closely spaced and relative motion averages out any effects on the polishing rate. A controller can cause the support to move the carrier head 70 to oscillate the substrate 10 laterally during the first duration, and to hold the substrate 10 at a fixed position laterally for a time at the second duration.

To reduce the removal of the edge portion 14 of the substrate 10, and to obtain a more uniformly polished substrate 10, a non-polishing area time share can be determined. For example, equation [1] can be used to determine the non-polishing area time share $S_1$:

$$S_1 = \frac{\alpha}{180} \quad [1]$$

where $\alpha$ is the angle subtended across the substrate 10 by the polishing control groove 102a relative to the center of the substrate, and can be determined using equations [2]-[3]:

$$\cos \alpha = \frac{R1^2 - r^2 - x^2}{2xr} \quad [2]$$

and $$\alpha = \cos^{-1} \frac{R1^2 - r^2 - x^2}{2xr} \quad [3]$$

and where R1 is the radius of the inner edge of the groove 102a, r is the radius of the substrate 10, and x is the distance from the center of the polishing pad 30 to the center of the substrate 10.

Figure 4A:
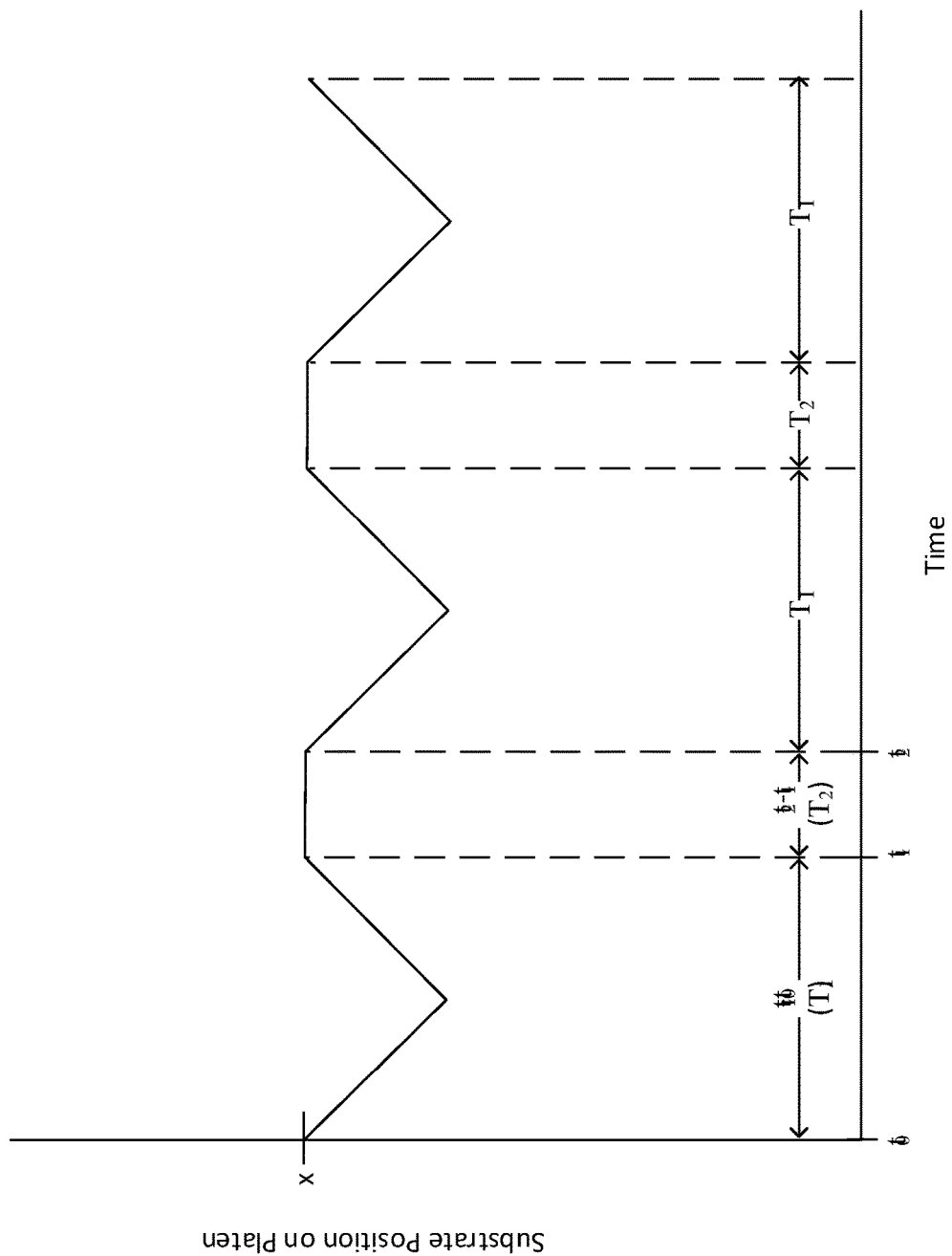
FIG. 4A is an exemplary graph of substrate position on platen versus time.

Referring now to FIGS. 3A and 4A, the central portion 12 of the substrate 10 and the edge portion 14 of the substrate 10 is positioned over the polishing area of polishing pad 30 for a first duration $T_1$ ($t_0$ to $t_1$). The substrate can be moved laterally in an oscillatory manner during this first duration. At the end of the first duration, the substrate is repositioned. The central portion 12 of the substrate 10 is positioned over the polishing area of the polishing pad 30 and the edge portion 14 of the substrate 10 is positioned and held over the non-polishing area of the polishing control groove 102 for a second duration $T_2$ ($t_1$ to $t_2$).

The process can be repeated so the substrate 10 oscillates between a first position—where the central portion and the edge portion of the substrate 10 is polished—for the first duration and a second position at the second duration, where the substrate is held at the second position—where the central portion of the substrate 10 is polished and the edge portion of the substrate 10 is not polished—for a duration calculated using the time share S.

The ratio of the first duration $T_1$ to the second duration $T_2$ can be selected so as to reduce the polishing rate of the edge portion 14 by a desired amount. For example the ratio $T_1/T_2$, can be selected to achieve a desired polishing rate at the edge, e.g., to achieve the same polishing rate as the center portion 12.

The ratio $T_2/(T_1+T_2)$ provides a percentage of time per cycle where the substrate, e.g., the edge portion 14b, is positioned and held over the groove 102 (also known as the dwell time), where a cycle is determined by the amount of time it takes for a substrate to return to the same position during one oscillation.

In general, if P is the polishing rate of the edge portion 14 without using the polishing control groove, and $P_{DES}$ is the desired polishing rate, then the ratio $T_2/(T_1+T_2)$ can be set as follows:

$$P_{DES} = P\left[1 - S_1\left(\frac{T_2}{T_1 + T_2}\right)\right]. \quad [4]$$

Figure 5:
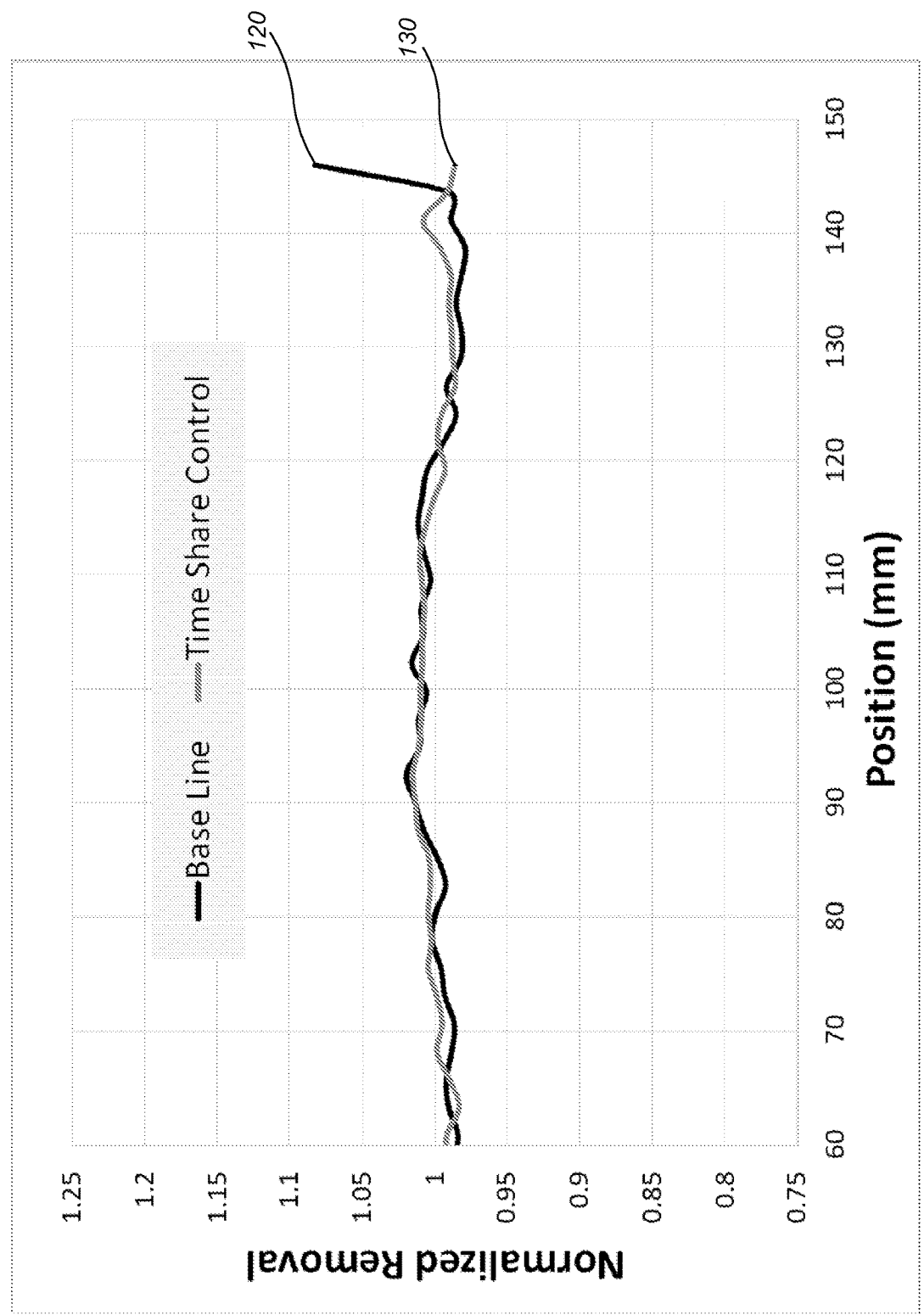
FIG. 5 is an exemplary graph showing a comparison of wafer edge uniformity from a base line removal and a time share control removal.

FIG. 5 is an exemplary graph showing a comparison of wafer edge uniformity from a base line polishing 120 of a substrate (e.g., substrate polishing without time share control) and a time share control polishing 130 of a substrate. The polishing of the central portions of the substrates is comparable between the base line polishing 120 and the time share control polishing 130, but the polishing of the edge portions of the substrates is approximately 9% higher for the base line polishing 120 that it is for the time share polishing 130. That is, following the base line removal 120, the edge portion of the substrate would be approximately 9% thinner than the central portion of the substrate. By using time share control, the substrate edge area was positioned to spend approximately 91% of the time over the polishing area, and approximately 9% of the time over the non-polishing area (e.g., for the time share S). Using time share control polishing 130, polishing non-uniformity was reduced.

Figure 3B:
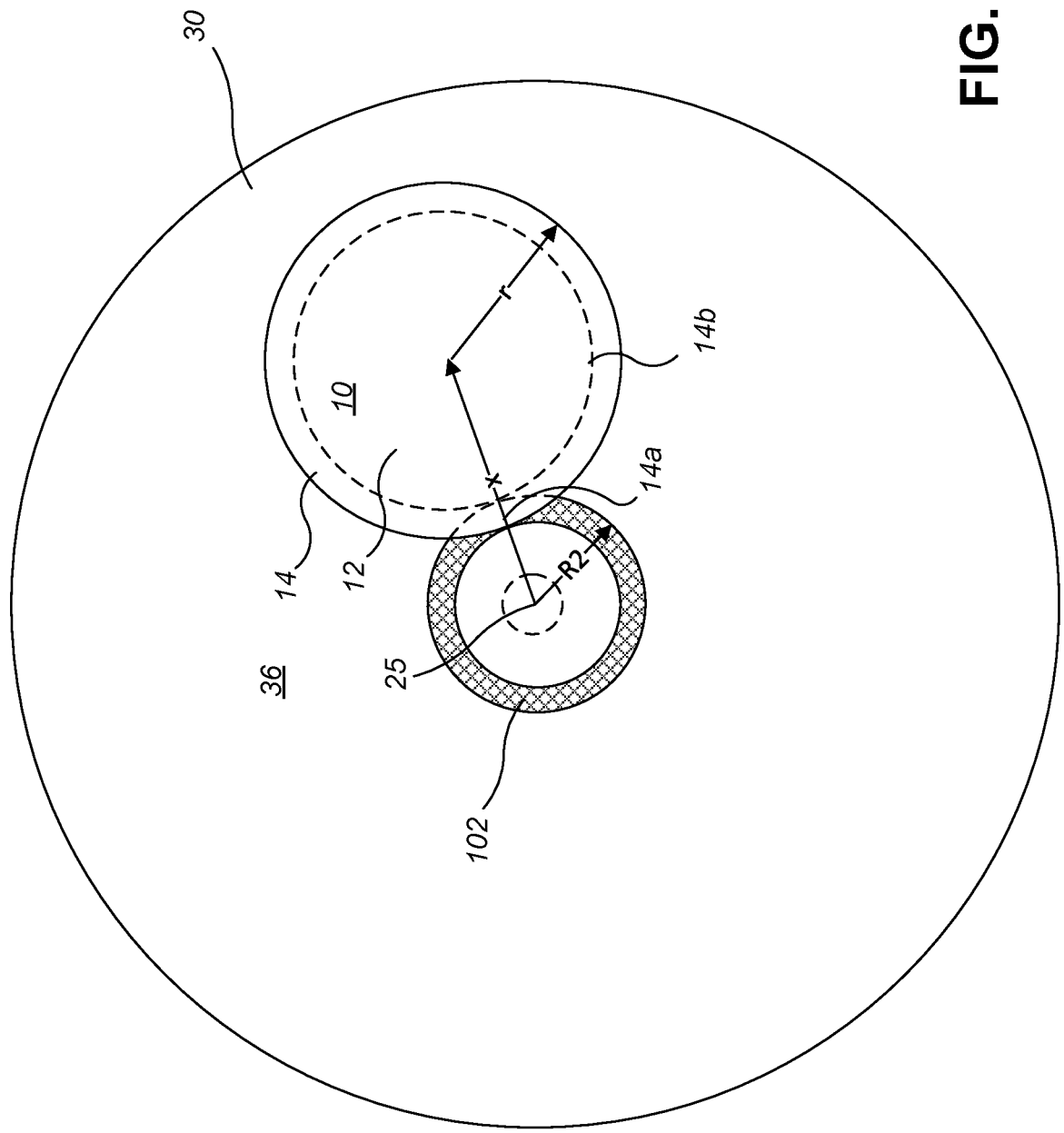
FIG. 3B is a schematic top view of another implementation of a polishing pad having a groove that is concentric with the axis of rotation.
Figure 4B:
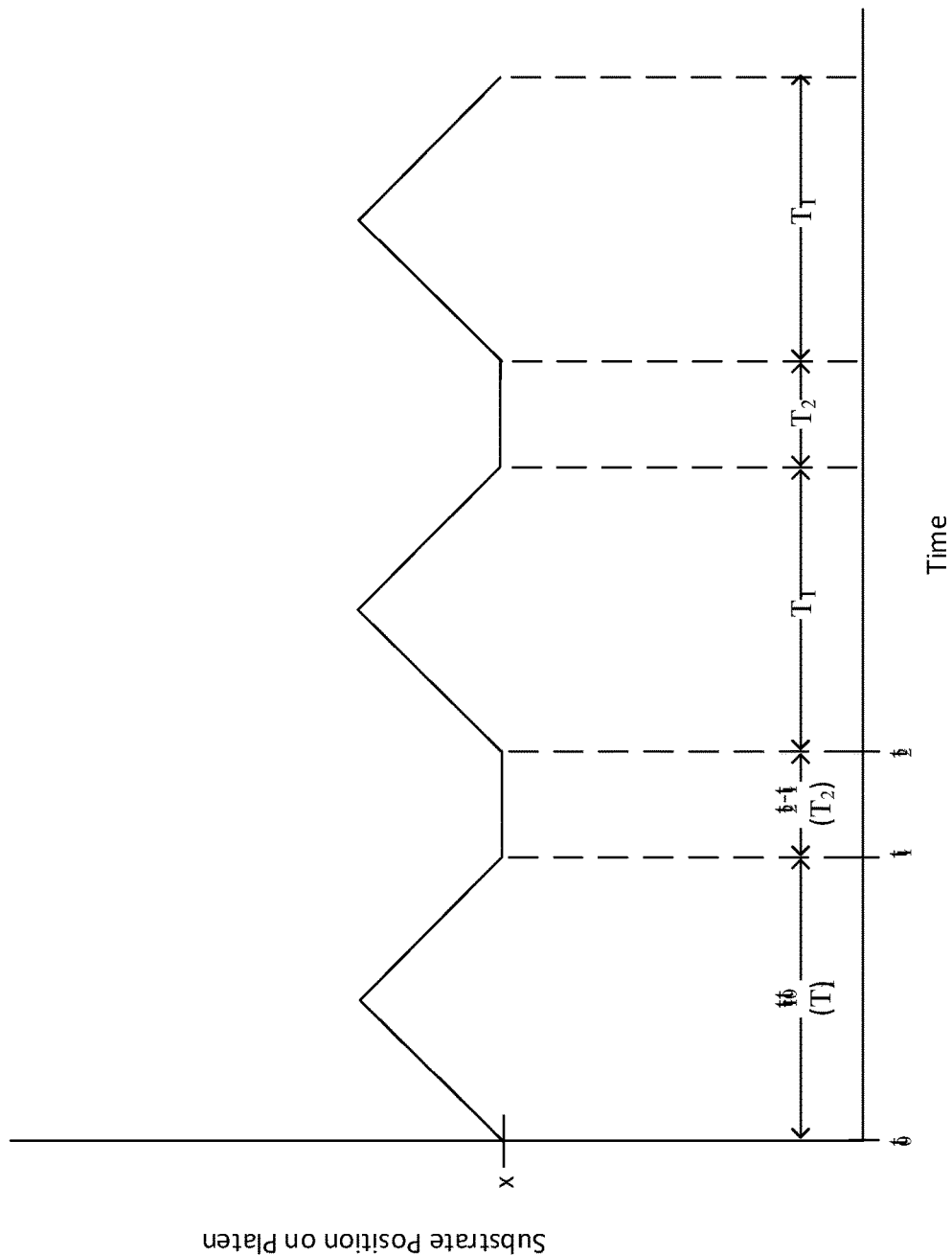
FIG. 4B is an exemplary graph of substrate position on platen versus time for another implementation.

Although FIG. 3A illustrates using a polishing pad with the polishing control groove 102a near the perimeter of the polishing pad 30, a similar process can be carried out using a polishing pad with the polishing control groove 102b near the center of the polishing pad 30. Referring to FIGS. 3B and 4B, for the polishing pad with the polishing control groove near the center, $P_{DES}$ can be calculated in a similar manner as described above, but using equations [5]-[8].

In particular, equation [5] can be used to determine the non-polishing area time share $S_2$:

$$S_2 = \frac{\beta}{180} \quad [5]$$

where $\beta$ is the angle subtended across the substrate 10 by the polishing control groove 102b relative to the center of the substrate, and can be determined using equations [6]-[7]:

$$\cos\beta = \frac{r^2 + x^2 - R2^2}{2xr} \quad [6]$$

and $$\alpha = \cos^{-1}\frac{r^2 + x^2 - R2^2}{2xr} \quad [7]$$

and where R2 is the radius of the outer edge of the polishing control groove 102b, r is the radius of the substrate 10, and x is the distance from the center of the polishing pad 30 to the center of the substrate 10.

Then if P is the polishing rate of the edge portion 14 without using the polishing control groove, and $P_{DES}$ is the desired polishing rate, then the ratio $T_2/(T_1+T_2)$ can be set as follows:

$$P_{DES} = P\left[1 - S_2\left(\frac{T_2}{T_1 + T_2}\right)\right]. \quad [8]$$

Figure 3C:
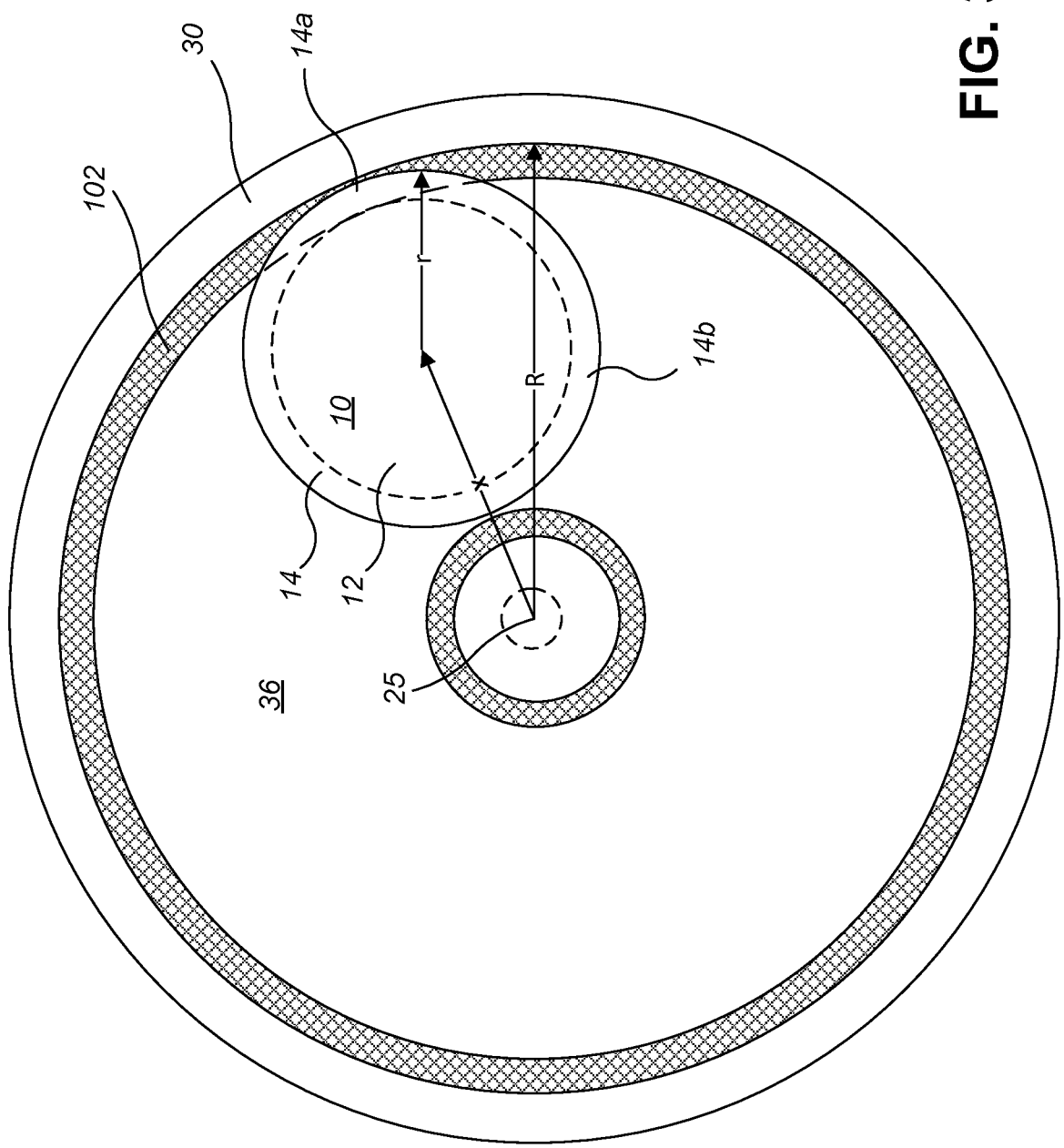
FIG. 3C is a schematic top view of another implementation of a polishing pad having two grooves that are concentric with the axis of rotation.
Figure 4C:
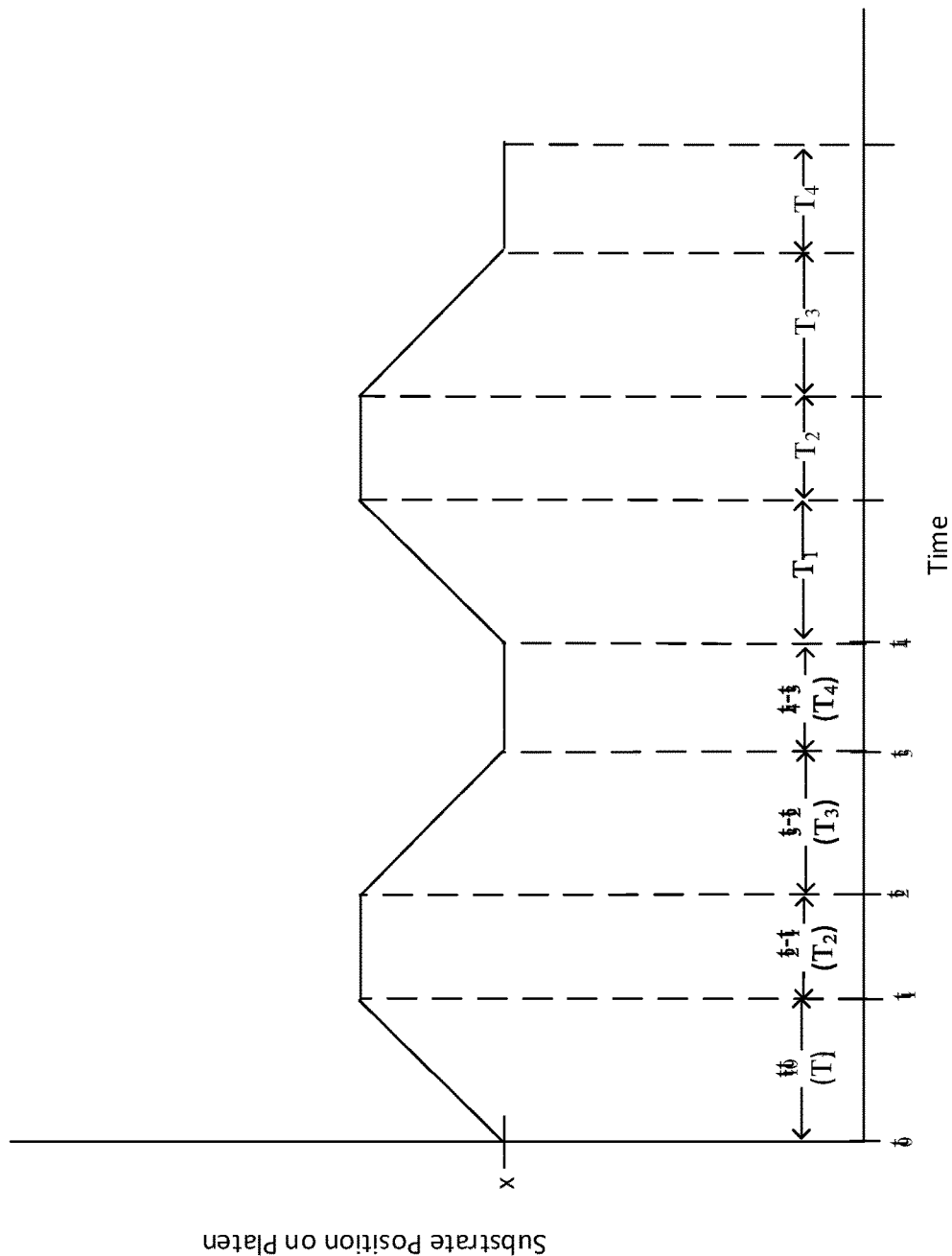
FIG. 4C is an exemplary graph of substrate position on platen versus time for another implementation.

Although FIGS. 3A and 3B illustrate using a polishing pad with a single polishing control groove 102, a similar process can be carried out using a polishing pad with two polishing control groove 102a, 102b. Referring now to FIGS. 3C and 4C, the central portion 12 of the substrate 10 and the edge portion 14 of the substrate 10 is positioned over the polishing area of polishing pad 30 for a first duration $T_1$ ($t_0$ to $t_1$). The substrate can be moved laterally in an oscillatory manner during this first duration, or simply move linearly across the polishing pad. At the end of the first duration, the substrate is repositioned with the central portion 12 of the substrate 10 is positioned over the polishing area of the polishing pad 30 and the edge portion 14 of the substrate 10 is positioned over the non-polishing area of the polishing control groove 102a near the perimeter of the polishing pad. The substrate can be held at this position for a second duration $T_2$ ($t_1$ to $t_2$). Next, the central portion 12 of the substrate 10 and the edge portion 14 of the substrate 10 is positioned over the polishing area of polishing pad 30 for a third duration $T_3$ ($t_2$ to $t_3$). The substrate can be moved laterally in an oscillatory manner during this first duration, or simply move linearly across the polishing pad. At the end of the third duration, the substrate is repositioned with the central portion 12 of the substrate 10 is positioned over the polishing area of the polishing pad 30 and the edge portion 14 of the substrate 10 is positioned over the non-polishing area of the polishing control groove 102b near the center of the polishing pad. The substrate can be held at this position for a fourth duration $T_2$ ($t_1$ to $t_2$).

If P is the polishing rate of the edge portion 14 without using the polishing control groove, and $P_{DES}$ is the desired polishing rate, then the ratios $T_2/(T_1+T_2+T_3+T_4)$ and $T_4/(T_1+T_2+T_3+T_4)$ can be set as follows:

$$P_{DES} = P\left[1 - S_1\left(\frac{T_2}{T_1+T_2+T_3+T_4}\right) - S_2\left(\frac{T_4}{T_1+T_2+T_3+T_4}\right)\right] \quad [9]$$

where S1 and S2 are calculated as described in equations [1]-[3] and [5]-[7].

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing system and methods can be applied in a variety of polishing systems. Either the polishing pad, or the carrier head, or both can move to provide relative motion between the polishing surface and the substrate. The polishing pad can be a circular (or some other shape) pad secured to the platen. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims. For example, the actions recited in the claims can be performed in a different order and still achieve desirable results.

What is claimed is:

1. A polishing system, comprising:
a platen rotatable about an axis;
a polishing pad having a polishing-control groove that is concentric with the axis of rotation and a polishing surface having a plurality of slurry-supply grooves, wherein the slurry-supply grooves are narrower than the polishing-control groove, and wherein the polishing-control groove surrounds the slurry-supply grooves;
a carrier head to hold a substrate against the polishing pad, the carrier head radially movable across the polishing pad;
an actuator to move the carrier head; and
a controller coupled to the actuator and configured to cause the carrier head to
for a first duration, oscillate the substrate laterally across the polishing pad such that a central portion of the substrate and an edge portion of the substrate are positioned over the polishing surface of the polishing pad, and
for a second duration, hold the substrate in a position such that the central portion of the substrate is positioned only over the polishing surface of the polishing pad and the polishing-control groove is positioned under only an arcuate region of the edge portion of the substrate for a second duration such that the central portion of the substrate is preferentially polished during the second duration.

2. The system of claim 1, wherein the slurry supply grooves are concentric with the polishing control groove.

3. The system of claim 1, wherein the polishing control groove is 5 to 30 mm wide.

4. The system of claim 1, wherein the polishing pad has a single polishing control groove.

5. The system of claim 4, wherein the first duration $T_1$ and the second duration $T_2$ satisfy $$P_{DES} = P\left[1 - S_1\left(\frac{T_2}{T_1 + T_2}\right)\right]$$

where P is a polishing rate of the edge portion without using the polishing control groove, $P_{DES}$ is a desired polishing rate, and $$S_1 = \frac{\alpha}{180}$$

where $\alpha$ is the angle subtended across the substrate by the polishing control groove relative to the center of the substrate.

6. The system of claim 1, wherein the polishing pad has a second polishing-control groove near a center of the polishing pad.

7. The system of claim 6, wherein the controller is configured to cause the carrier head to
for the first duration, move the substrate laterally across the polishing pad such that the central portion of the substrate and the edge portion of the substrate are positioned over the polishing surface of the polishing pad;
for the second duration, hold the substrate in a position such that the central portion of the substrate is positioned over the polishing surface of the polishing pad and the edge portion of the substrate is positioned over a first polishing control groove;
for a third duration, move the substrate laterally across the polishing pad such that a central portion of the substrate and an edge portion of the substrate are positioned over the polishing surface of the polishing pad; and
for a fourth duration, hold the substrate in a position such that the central portion of the substrate is positioned over the polishing surface of the polishing pad and the edge portion of the substrate is positioned over a second polishing control groove.

8. A polishing system, comprising:
a platen rotatable about an axis;
a polishing pad having a polishing-control groove that is concentric with the axis of rotation and a polishing surface having a plurality of slurry-supply grooves, wherein the slurry-supply grooves are narrower than the polishing-control groove, and wherein the slurry-supply grooves surround the polishing-control groove;
a carrier head to hold a substrate against the polishing pad, the carrier head radially movable across the polishing pad;
an actuator to move the carrier head; and
a controller coupled to the actuator and configured to cause the carrier head to
for a first duration, oscillate the substrate laterally across the polishing pad such that a central portion of the substrate and an edge portion of the substrate are positioned over the polishing surface of the polishing pad, and
for a second duration, hold the substrate in a position such that the central portion of the substrate is positioned only over the polishing surface of the polishing pad and the polishing-control groove is positioned under only an arcuate region of the edge portion of the substrate for a second duration such that the central portion of the substrate is preferentially polished during the second duration.

9. The system of claim 8, wherein the slurry supply grooves are concentric with the polishing control groove.

10. The system of claim 8, wherein the polishing control groove is 5 to 30 mm wide.

11. The system of claim 8, wherein the polishing pad has a single polishing control groove.

12. The system of claim 11, wherein the first duration $T_1$ and the second duration $T_2$ satisfy $$P_{DES} = P\left[1 - S_2\left(\frac{T_2}{T_1 + T_2}\right)\right].$$

where P is a polishing rate of the edge portion without using the polishing control groove, $P_{DES}$ is a desired polishing rate, and $$S_2 = \frac{\beta}{180}$$

where $\beta$ is the angle subtended across the substrate by the polishing control groove relative to the center of the substrate.

13. The system of claim 8, wherein the polishing pad has a second polishing-control groove near an edge of the polishing pad.

14. The system of claim 13, wherein the controller is configured to cause the carrier head to
- for the first duration, move the substrate laterally across the polishing pad such that the central portion of the substrate and the edge portion of the substrate are positioned over the polishing surface of the polishing pad;
- for the second duration, hold the substrate in a position such that the central portion of the substrate is positioned over the polishing surface of the polishing pad and the edge portion of the substrate is positioned over a first polishing control groove;
- for a third duration, move the substrate laterally across the polishing pad such that a central portion of the substrate and an edge portion of the substrate are positioned over the polishing surface of the polishing pad; and
- for a fourth duration, hold the substrate in a position such that the central portion of the substrate is positioned over the polishing surface of the polishing pad and the edge portion of the substrate is positioned over a second polishing control groove.

* * * * *